United States Patent [19]

McCarthy

[11] 4,215,361
[45] Jul. 29, 1980

[54] WINGED SELF-FASTENED HEAT SINKS FOR SEMICONDUCTOR DEVICES

[75] Inventor: Alfred F. McCarthy, Belmount, N.H.

[73] Assignee: Aavid Engineering, Inc., Laconia, N.H.

[21] Appl. No.: 941,550

[22] Filed: Sep. 12, 1978

[51] Int. Cl.² ............ H01L 23/02; H01L 23/48; H01L 29/44
[52] U.S. Cl. .................... 357/81; 357/68; 165/80 A; 174/16 HS
[58] Field of Search ................. 357/81, 68; 165/80 A–80 D; 174/16 HS

[56] References Cited

U.S. PATENT DOCUMENTS

| 3,247,896 | 4/1966 | Chu et al. | 357/81 |
| 3,407,868 | 10/1968 | Coe | 357/81 |
| 3,548,927 | 12/1970 | Spurling | 357/81 |
| 3,572,428 | 3/1971 | Monaco | 357/81 |
| 3,670,215 | 6/1972 | Wilkens et al. | 357/81 |
| 3,893,161 | 7/1975 | Pesak | 357/81 |

Primary Examiner—Andrew J. James
Attorney, Agent, or Firm—James E. Mrose

[57] ABSTRACT

Heat accumulating about the plastic housing and metallic tab of a miniature electronic semiconductor power device is dissipated by a surrounding one-piece sheet metal heat sink shaped as a closely-fitting channel portion closed at the bottom but open-slotted midway along the top; from margins of the top slot, a pair of integral fingers spring downwardly to engage and hold a plastic semiconductor package within it, and from the same margins a pair of upwardly and laterally-flaring spaced broad-area fins are also spread to enhance transfer of heat away from the site at which a tab of a device is held within.

4 Claims, 6 Drawing Figures

WINGED SELF-FASTENED HEAT SINKS FOR SEMICONDUCTOR DEVICES

BACKGROUND OF THE INVENTION

The present invention relates to improvements in heat sinks for electronic semiconductor devices, especially so-called plastic power devices having both metallic tabs and plastic-encapsulated semiconductor packages, and, in one particular aspect, to novel and improved resilient one-piece sheet-metal heat-dissipating attachments for miniature plastic power devices which are of economical manufacture and may be readily mounted in place as self-holding heat sinks making intimate broad-area thermally-conductive contacts and exhibiting relatively large radiating surfaces and ample air-circulation channels.

As is well known, applications of small-size electronic semiconductor devices and circuit modules are severely limited in respect of the self-generated heat which they can successfully expel and prevent from building up as they are called upon to operate at higher and higher powers. In some instances, the environments of use permit elaborate forced-liquid cooling systems to be employed, but a very common and economical expedient instead involves the attachment of small finned metal extrusions or stampings which help to conduct and radiate heat away from the thermally-vulnerable regions. To further the latter purposes, encapsulated semiconductor devices or packages are sometimes provided with exposed heat-transfer parts, such as relatively thick metal tabs or plates, which promote thermal-energy transfer to such attachments and, in turn, to the ambient environment. The heat-dissipating attachments intended for use with such heat-transfer parts may include a resilient spring-clip member cooperating with a heat-dissipating base (as in U.S. Pat. Nos. 3,548,927 and 4,054,901), or such attachments may take the form of the single stamped sheet-metal body shaped both to promote cooling and to hold itself in place (U.S. Pat. Nos. 3,893,161 and 4,012,769 and 4,041,524).

Ease and convenience of fitting heat-sink attachments are important factors, as are, also, the creation and maintenance of broad-area efficient and effective heat-exchange paths for both conductive and convective modes of cooling. However, when auxiliary fasteners and tools must be used, the fastening operations can become quite awkward, and, when self-clipping arrangements are exploited instead, their designs may permit only small-area contacting to occur where one would prefer to develop broader areas for maximum heat-transfer. If intimate tightly-sprung broad-area regions of clamping are designed into a heat sink, it may then be difficult to force it into place and to avoid damage both to the device, which may itself be rather small and delicate, and to its frail leads. In accordance with the present teachings, such difficulties are reduced by way of heat-sink attachments which may be fabricated inexpensively and with good utilization of sheet metal stock which is stamped and bent to a trough-like body having intergral fingers which spring inwardly from along a slotted side to engage and hold a plastic semiconductor package inside it and in good contact with its inner surfaces, and in which the slot margins merge with a pair of broad-area fins spread and spaced to transfer heat away from the body.

SUMMARY OF THE INVENTION

The present invention is aimed at creating self-fastened heat sinks which offer marked advantage in respect of economy of manufacture, ease of installation and use, and promotion of efficient heat-transfers, especially in connection with the cooling of miniature power-tab type semiconductor devices. In one preferred embodiment, such a heat sink is fashioned as a unitary stamped-sheet-metal item having three principal portions: first, a relatively shallow channel- or trough-shaped body of substantially rectangular cross-section, the top of which is open along a narrow central longitudinal slot; second, a pair of resilient elongated fingers each formed of body material near adjacent edges of the slot and bent to extend slightly inwardly; and, third, a pair of broad-area fins spreading oppositely in gull-wing fashion from adjacent edges of the slot and preferably extending laterally beyond the sides of the body and thence downwardly parallel with those sides, while everywhere spaced from the body portion to admit of convective cooling. The depth of the hollow body portion is selected to be only slightly in excess of the thickness of a given plastic power package, such as a TO-220 type package, such that the latter may be slipped inside it and held in place by the resilient fingers; the width of that same body portion just accommodates the width of the same package, and its overall length is at least the same as that of the package. Where bolt-mounting is to be accommodated, through an opening in the metallic tab of the semiconductor package, the body portion of the heat sink is correspondingly apertured through its base, and, in addition, the margins of the slot and parts of the fins are relieved to allow needed access.

Accordingly, it is one of the objects of the present invention to provide a unique and advantageous heat sink, which is especially useful with miniature electronic plastic power packages of the power-tab type, having a channel-shaped sheet-metal body with unitary resilient portions for holding a package and tab securely within it and having heat-dissipating fins which are broad-area extensions of the body material.

A further object is to provide a miniature stamped sheet-metal heat sink, for power-tab type semiconductor devices and the like, in which a body channel receives such a device closely within it from one open end and clasps it in place via integral fingers and dissipates heat convectively via gull-wing type fins extending from margins of the channel material and overlying the channel on three sides in spaced relation thereto.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

DETAILED DESCRIPTION OF THE PREFERRED EMBODIMENTS

Figure 1:
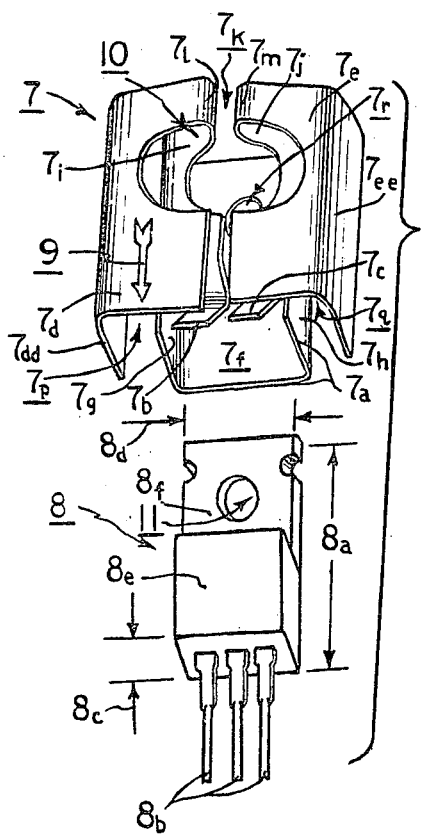
FIG. 1 is a pictorial view of a heat sink embodying the present invention, together with a power package with which it may be mated to dissipate heat.

Having reference to the drawings, wherein like reference characters designate identical or corresponding parts throughout the different views, and more particularly to FIG. 1 thereof, one embodiment of an improved heat-sink unit, 7, is shown in closely-spaced relation to a so-called "plastic power package", 8, onto which it may be fitted by advancing it in the direction of arrow 9. Typically, a miniature package such as 8 may have an overall length, 8a, exclusive of its slender leads 8b, which is only slightly greater than one-half inch, and a thickness, 8c, which is only slightly greater than one-eighth inch, and a width, 8d, which is only slightly less than one-half inch. The plastic-encapsulated body part, 8e, merges with a relatively thick conductive metal tab, 8f, which serves both to mount the sensitive encapsulated semiconductor element and its connections and to conduct enough heat away from them to permit operation at significant electrical power levels. However, tab 8f may not be of an optimum form for sufficient heat dissipation in some conditions of use, and it may then become necessary to augment the cooling by way of further heat-sink material.

Figure 2:
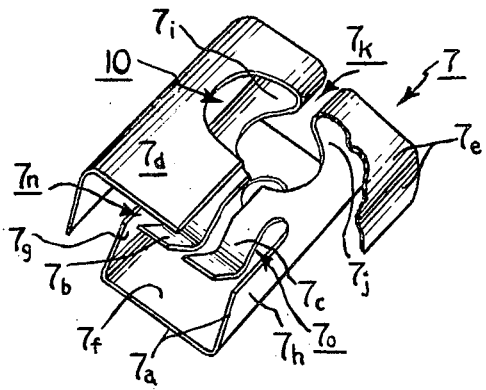
FIG. 2 provides a further pictorial view of the same heat sink, with portions broken away to expose internal structural detail.
Figure 4:
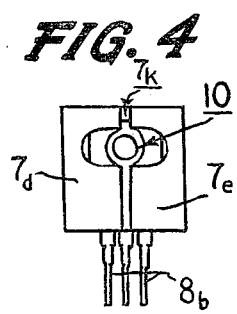
FIG. 4 is a front plan view of a heat sink such as that of FIG. 1 in assembled relationship with a power package such as that of FIG. 1.
Figure 5:
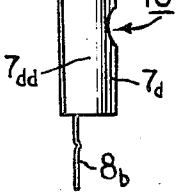
FIG. 5 is view of the assembly of FIG. 4 taken toward the left side thereof as it appears in FIG. 4.
Figure 6:
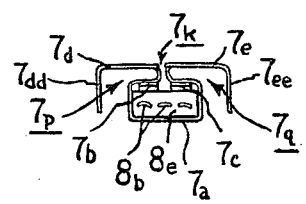
FIG. 6 is an end view of the same assembly taken toward the bottom thereof as it appears in FIG. 4.

The unit 7 does so by fitting closely with the package, fully along the flat back where tab 8f is disposed, and by holding itself affixed to the package, and by exposing broad areas of metal to the ambient atmosphere, and by forming ducts through which the ambient may flow in heat-transporting currents. For those purposes, the improved heat-sink is fashioned to include a central trough- or channel-shaped body portion, 7a, of substantially rectangular cross-section, and a pair of integral resilient holding members, 7b and 7c, and a pair of integral gull-wing shaped fins 7d and 7e which are in a spaced wrap-around relationship to three sides of the body portion. Overall length of the body portion, and preferably of the fins 7d and 7e as well, is at least equal to the overall length 8a of the semiconductor power package with which the heat sink is intended for use, such that the flat back of the package body 8e and its tab 8f may fully abut interior flat surfaces of the bottom wall 7f of the body portion when the package 8 and heat-sink 7 are properly mated (FIGS. 4-6). Upstanding side walls 7g and 7h of that body portion are spaced apart just adequately to accommodate the package width 8d, and are intentionally made somewhat higher than the height 8c of the cooperating package. However, the heightwise clearance which would exist when the package is inserted within the body portion (FIG. 6) does not result in looseness of the mating, because depending resilient members 7b and 7c will bear against the top of package body 8e, thereby continuously urging the tab and package body into intimate heat-exchange contact with bottom wall 7f. As is evident from FIG. 2, members 7b and 7c are conveniently formed from body-portion material which has been bent over inwardly from side walls 7g and 7h as top wall portions 7i and 7j, respectively. The latter two wall portions are separated from one another by a central longitudinal top slot, 7k, bordered by the two resilient members 7b and 7c near one longitudinal end, and near the other end by upstanding roots 7l and 7m for the laterally-spreading fins 7d and 7e, respectively. Top wall slots 7n and 7o, separating the other edges of members 7b and 7c from side walls 7g and 7h, allow for the needed vertical flexibility of those members, which are also V-crimped near their free ends so that they may more readily slide over the edge of a package body as it is being mated with the heat-sink unit.

Root sections 7l and 7m afford a desirable vertical spacing of fins 7d and 7e from the top of the body portion of the unit, and spacings 7p and 7q (FIGS. 1 and 6) are likewise maintained between the side walls and downwardly-bent ends 7dd and 7ee of the two fins, such that ducting or chimney-type heat-transport by convection currents will be promoted. Those root sections are of relatively short length in the illustrated embodiment because metal has been relieved to develop a relatively wide circular top opening 10 which allows access to and for a bolt, screw or other fastener (not illustrated) which will pass through a tab hole 11 and serve to fasten the assembly to a circuit board or the like, or to bolt the heat-sink and semiconductor package together more tightly. A like hole, 7r, may then be provided in the bottom wall 7f, at the appropriate matching location in relation to tab hole 11.

Figure 3:
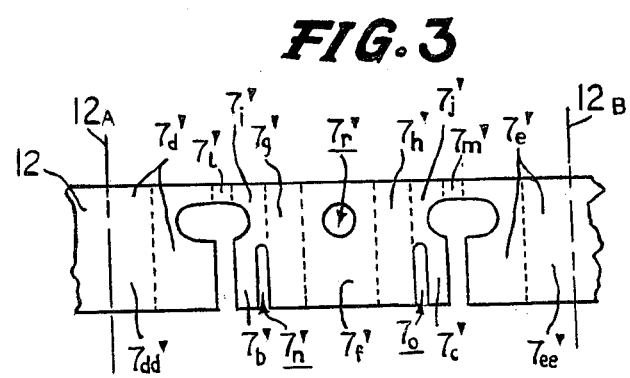
FIG. 3 depicts a stamped sheet-metal strip having portions cut away to promote the fashioning of a heat sink like that of FIGS. 1 and 2.

In FIG. 3, a metal strip 12 is shown to have stampings appropriate to the formation of a heat-sink unit such as unit 7, and it should be understood that the pattern of such stamping is repetitive beyond the cutting lines 12A and 12B. Reference characters distinguished by single-prime accents are there otherwise the same as those which designate elements and features of the unit 7 appearing in the other illustrations, and the relationships between the flat stamping and finished three-dimensional heat-sink unit will therefore be readily appreciated without need for a separate detailed explanation. The sheet material which is used has good thermal conductivity and enough resilience and thickness to serve the purposes of transferring adequate amounts of heat and clamping the unit to a package. Slotting 7k along the entire top of the body portion of the unit also promotes a flexibility by which the body portion may be opened somewhat to more readily receive and fasten itself to a package.

Although a substantially planar-sheet construction has been illustrated, it should be evident that improved thermal "matching" may be provided by way of various apertures, corrugations, tabs, fingers and the like at locations accommodating them. Central opening 10 may not be required in some instances, and, in other instances the material removal for such an opening may be dispensed with in favor of having the roots 7l and 7m for the fins made longer and closer to the side walls, leaving a wider noncircular spacing for need access to interior of the unit. The holding fingers or members 7b and 7c may likewise be of different configuration and cantilevered for equivalent holding or clamping action in other than the specifically-illustrated fashion. Further, for some applications, the unit 7 may also be provided with end tabs or "feet" which will fit into cooperating circuit board or chassis slots, for vertical mounting and locating of the unit and package. Where no separate fastener is to be used, but the heat-sink and package are to be positioned and held more accurately and firmly, the bottom of the body portion of the unit may have an upwardly-bulging detent or dimple at the locus of the illustrated hole 7r.

It should therefore be understood that the specific embodiments and practices shown and described herein have been presented by way of disclosure rather than limitation, and that various modifications, combinations and substitutions may be effected by those skilled in the art without departure in spirit or scope from this invention in its broader aspects and as set forth in the appended claims.

What I claim as new and desire to secure by Letters Patent of the United States is:

1. A resilient sheet-metal unitary heat sink unit comprising an open-ended channel-shaped body portion of substantially rectangular cross-section closed at the bottom and having upstanding parallel sides along spaced edges thereof and having top wall surfaces including two top wall parts extending from the sides toward but short of each other, leaving a slot therebetween, means projecting downwardly from said top wall parts toward the interior of said channel-shaped body portion in position to develop a resilient interference fit with part of an electronic semiconductor package of predetermined size when the latter is disposed within said body portion, and cooling-fin means extending upwardly in integral continuation of said top wall surfaces and thence flaring laterally substantially parallel with said top wall surfaces and in spaced relation thereto.

2. A heat sink unit is set forth in claim 1 wherein said cooling-fin means comprises a pair of gull-wing shaped fins each extending upwardly in integral continuation of said top wall surfaces and thence laterally in opposite directions and thence downwardly in externally-spaced relation to said sides.

3. A heat sink unit as set forth in claim 1 wherein the slot left between said top wall parts runs longitudinally along the top of said body portion midway between said sides, wherein said means projecting downwardly comprises a pair of resilient cantilevered members each extending alongside the slot from a different one of said top wall parts, said cantilevered members being of length adjacent the slot which is less than that of said body portion and slot, said resilient cantilevered members being elongated and finger-like and extending alongside the slot with their free ends extending toward one open end of said body portion, and wherein said cooling-fin means comprises a pair of substantially planar fins each extending upwardly in integral continuation of a different one of said top wall parts from regions alongside the slot not occupied by said cantilevered members and thence flaring laterally back over the top wall part of which it is a continuation.

4. A miniature unitary resilient heat sink fashioned of sheet metal, comprising an open-ended channel-shaped body portion of substantially rectangular cross-section proportioned to accommodate the rectangular cross-section of the plastic-encapsulated body package of an electronic semiconductor device of the type having a flat metallic tab along the back of the body package and extending outwardly therefrom, said channel-shaped body portion having a flat bottom and upstanding sides along the spaced edges thereof and two top wall parts extending from the sides toward but short of each other and leaving a slot therebetween, a pair of elongated resilient cantilevered members each extending alongside the slot from a different one of said top wall parts with their free ends extending toward one open end of said body portion, said members being cut from said top wall parts, and a pair of substantially planar cooling fins each extending upwardly in integral continuation of a different one of said top wall parts from regions alongside the slot near the other open end of said body portion and thence flaring laterally back over and parallel to the top wall part of which it is a continuation and thence turning downwardly in spaced parallel relation to the nearby one of said sides, each of said cooling fins and the top wall parts inderlying them being relieved of metal to form, together, an opening wider than the slot for access from above to the interior of the body portion, whereby at least part of the metal tab of a semiconductor device disposed within said body portion and clamped by said members is accessible from the top side of the heat sink.

* * * * *